(12) United States Patent
He

(10) Patent No.: US 11,054,464 B2
(45) Date of Patent: Jul. 6, 2021

(54) TEST METHOD AND TEST DEVICE

(71) Applicant: HKC CORPORATION LIMITED, Shenzhen (CN)

(72) Inventor: Huailiang He, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 16/312,013

(22) PCT Filed: Jan. 16, 2018

(86) PCT No.: PCT/CN2018/072855
§ 371 (c)(1),
(2) Date: Dec. 20, 2018

(87) PCT Pub. No.: WO2019/134190
PCT Pub. Date: Jul. 11, 2019

(65) Prior Publication Data
US 2020/0326369 A1  Oct. 15, 2020

(30) Foreign Application Priority Data

Jan. 3, 2018 (CN) .......................... 201810004915.8

(51) Int. Cl.
*G01R 31/28* (2006.01)
*G09G 3/00* (2006.01)

(52) U.S. Cl.
CPC ......... *G01R 31/2886* (2013.01); *G09G 3/006* (2013.01)

(58) Field of Classification Search
CPC .............................. G01R 31/2886; G09G 3/006
See application file for complete search history.

(56) References Cited

U.S. PATENT DOCUMENTS

| 7,026,832 B2* | 4/2006 | Chaya | G01R 31/2891 324/754.1 |
| 8,666,691 B2* | 3/2014 | Ishikawa | G01R 31/31711 702/123 |

(Continued)

FOREIGN PATENT DOCUMENTS

| CN | 101958263 A | 1/2011 |
| CN | 102707215 A | 10/2012 |
| CN | 103439643 A | 12/2013 |

OTHER PUBLICATIONS

International Search Report and Written Opinion issued in PCT/CN2018/072855, dated Sep. 27, 2018.

*Primary Examiner* — Akm Zakaria
(74) *Attorney, Agent, or Firm* — Westbridge IP LLC

(57) ABSTRACT

The present application provides a test method and a test device, the test method includes: acquiring a coordinate of a test point of a sample to be tested; driving a probe to a position corresponding to the coordinate of the test point to perform a test according to the coordinate of the test point of the sample to be tested, and acquiring a first test result; determining whether the first test result is within a preset range or not; retesting on the position corresponding to the coordinate of the test point and acquiring a second test result, if the first test result is beyond a preset range; and driving the probe to a next test point in the sample to be tested to perform a test according to a preset test mode, after acquiring the second test result.

2 Claims, 2 Drawing Sheets

(56) References Cited

U.S. PATENT DOCUMENTS

| | | | |
|---|---|---|---|
| 2006/0158208 A1* | 7/2006 | Abboud | G09G 3/006 324/755.01 |
| 2006/0170434 A1* | 8/2006 | Grube | G01R 31/2886 324/750.23 |
| 2007/0029994 A1* | 2/2007 | Dembo | G01R 31/3025 324/762.01 |
| 2018/0173618 A1* | 6/2018 | Hu | G06F 11/3672 |
| 2019/0064120 A1* | 2/2019 | Yamamoto | G01N 29/0645 |

\* cited by examiner

TEST METHOD AND TEST DEVICE

CROSS-REFERENCE TO RELATED APPLICATION

This application is the PCT Application No. PCT/CN2018/072855 for entry into US national phase, with an international filing date of Jan. 16, 2018 designating US, now pending, and claims priority to Chinese Patent Application No. 201810004915.8, filed on Jan. 3, 2018, the content of which is incorporated herein by reference in its entirety.

TECHNICAL FIELD

The present application relates to the technical field of testing, and more particularly to a test method and a test device.

BACKGROUND

In a manufacturing process of a liquid crystal panel or an LED chip, it is necessary to perform a point measurement on pixel units in the liquid crystal panel or on crystal grains of LED (Light Emitting Diode) to determine whether the pixel units or the crystal grains are normal or abnormal; if the pixel units or the crystal grains are abnormal, these abnormal pixel units will be repaired or these crystal grains with abnormal manufacturing process will be removed.

The existing point measurement mode is performing the point measurement on all pixel units in the liquid crystal panel or on all crystal grains in the LED wafer treated by laser cut, after the point measurement, the specification of point measurement is set according to an upper limit and a lower limit of SPC (Statistical Process Control) measurement specification, the pixel units or crystal grains which are beyond the range between the upper limit and the lower limit of the point measurement specification are set as abnormal pixel units or abnormal crystal grains; however, since an abnormal point measurement may be caused by the test device (e.g., puncture deflection of probe, the probe doesn't puncture at the test point or on the electrode) during the point measurement of the test device but not by an abnormal manufacturing process; in this situation, it needs to perform a point measurement again on the abnormal pixel units or on the abnormal crystal grains beyond the range between the upper limit and the lower limit of the specification in the first point measurement according to the coordinates recorded during the first point measurement, so as to determine whether these pixel units or these abnormal crystal grains are due to abnormal point measurement or abnormal manufacturing process. The process of performing the point measurement on the abnormal pixel units or on the abnormal grains again requires a mechanical arm to perform another measurement according to the measurement sequence of the abnormal pixel units or the abnormal crystal grains, which causes a waste of time of the point measurement, and low efficiency of the point measurement.

SUMMARY

In view of this, the present application provides a test method and a test device, which can save time spent on moving among a plurality of test points and improve the efficiency of point measurement.

The present application provides a test method, including:

acquiring a coordinate of a test point of a sample to be tested;

driving a probe to a position corresponding to the coordinate of the test point to perform a test according to the coordinate of the test point of the sample to be tested, and acquiring a first test result;

determining whether the first test result is within a preset range or not;

retesting on the position corresponding to the coordinate of the test point and acquiring a second test result, if the first test result is beyond the preset range; and driving the probe to a next test point in the sample to be tested to perform a test according to a preset test mode, after acquiring the second test result.

The present application further provides a test device, including:

test point coordinate acquisition module configured to acquire a coordinate of a test point of a sample to be tested;

a first test result acquisition module configured to drive a probe to a position corresponding to the coordinate of the test point to perform a test according to the coordinate of the test point of the sample to be tested, and acquire a first test result;

a determination module configured to determine whether the first test result is within a preset range or not;

a second test result acquisition module configured to retest on the position corresponding to the coordinate of the test point and acquire a second test result, if the first test result is beyond the preset range; and a processing module configured to acquire the second test result on the position corresponding to the coordinate of the test point and drive the probe to a next test point in the sample to be tested according to a preset test mode to perform a test.

The present application further provides a test method, including:

acquiring a coordinate of a test point of a sample to be tested;

driving a probe to a position corresponding to the coordinate of the test point to perform a test according to the coordinate of the test point of the sample to be tested, and obtaining a first test result;

determining whether the first test result is within a preset range or not;

retesting on the position corresponding to the coordinate of the test point and acquiring a second test result, if the first test result is beyond the preset range;

driving the probe to a next test point of the sample to be tested to perform the test according to a preset test mode, after acquiring the second test result;

the preset test mode is to drive, according to a current position, the probe to step from a current test point to a next test point according to a preset step size; and sending out first prompt information prompting that the sample to be tested is abnormal, if the number of the test points with second test results beyond the preset range is continuously detected to be greater than a preset number.

The present application further provides a test device, the test device includes: a memory, a processor and computer program stored in the memory and executable by the processor, the processor executes the computer program to implement steps in the test method provided by the present application.

The present application further provides a computer readable storage medium, the computer readable storage medium can be nonvolatile, the computer readable storage medium stores computer program thereon, the computer program, when being read and executed by one or a plurality of processor(s), can be configured to implement steps in the test method provided above.

In an embodiment of the present application, the coordinate of the test point of the sample to be tested is acquired; the probe is driven to the position corresponding to the coordinate of the test point according to the coordinate of the test point of the sample to be tested, and the first test result is acquired; the position corresponding to the coordinate of the test point is retested and the second test result is acquired if the first test result is beyond the preset range; after the second test result is acquired, the probe is driven to the next test point of the sample to be tested to perform the test according to the preset test mode. Time spent on moving among the plurality of test points can be saved, and the efficiency of point measurement can be improved. Moreover, this method needs not to make improvement in hardware, has a convenient operation, is easy to be implemented, has a wide adaptability, and has a strong usability and practicability.

BRIEF DESCRIPTION OF THE DRAWINGS

In order to explain the embodiments of the present application more clearly, a brief introduction regarding the accompanying drawings that need to be used for describing the embodiments or the prior art is given below; it is obvious that the accompanying drawings described as follows are only some embodiments of the present application, for the ordinarily skilled one in the art, other drawings can also be obtained according to the current drawings on the premise of paying no creative labor.

EMBODIMENTS OF THE PRESENT APPLICATION

Technical solutions in the embodiments of the present application will be described clearly and comprehensively below with reference to accompanying drawings in the embodiments, it is obvious that, the embodiments to be described are merely part of the embodiments of the present application, but not the whole of the embodiments. Based on the embodiments of the present application, some other embodiments may be obtained by ordinarily skilled one in the art at the premise of paying no creative labor and are all included in the protection scope of the present application.

It should be understood that, when a term "comprise/include" is used in the description and annexed claims, the term "comprise/include" indicates existence of the described characteristics, integer, steps, operations, elements and/or components, but not exclude existence or adding of one or more other characteristics, integer, steps, operations, elements, components and/or combination thereof.

It should also be understood that, terms used in the description of the present application are for the purpose of describing specific embodiments but not intended to limit the present application. As is used in the description and the annexed claims of the present application, singular forms of terms such as "a", "one", "the" are intended to include plural forms unless other conditions are indicated clearly in the context.

It should be further understood that, terms "and/or" used in the description and the annexed claims of the present application are referred to as any combination of one or a plurality of listed item(s) associated with each other and all possible items, and including these combinations.

As used in the description and the annexed claims, a term "if" can be interpreted as "when" or "once" or "in response to determination" or "in response to detection". Similarly, terms such as "if it is determined that", or "if it is detected that (a described condition or event)" can be interpreted as "once it is determined" or "in response to the determination" or "once it is detected that (the described condition or event)" or "in response to the detection (the described condition or event)".

In order to describe the technical solution of the present application, the present application will be described with reference to specific embodiments of the present application below.

The test device in the embodiments of the present application refers to the device which performs a test on the sample to be tested according to the following method and is not intended to limit the test device in the name of prober. The test device in the embodiments of the present application should be understood broadly by the ordinarily skilled one in the art.

Figure 1:
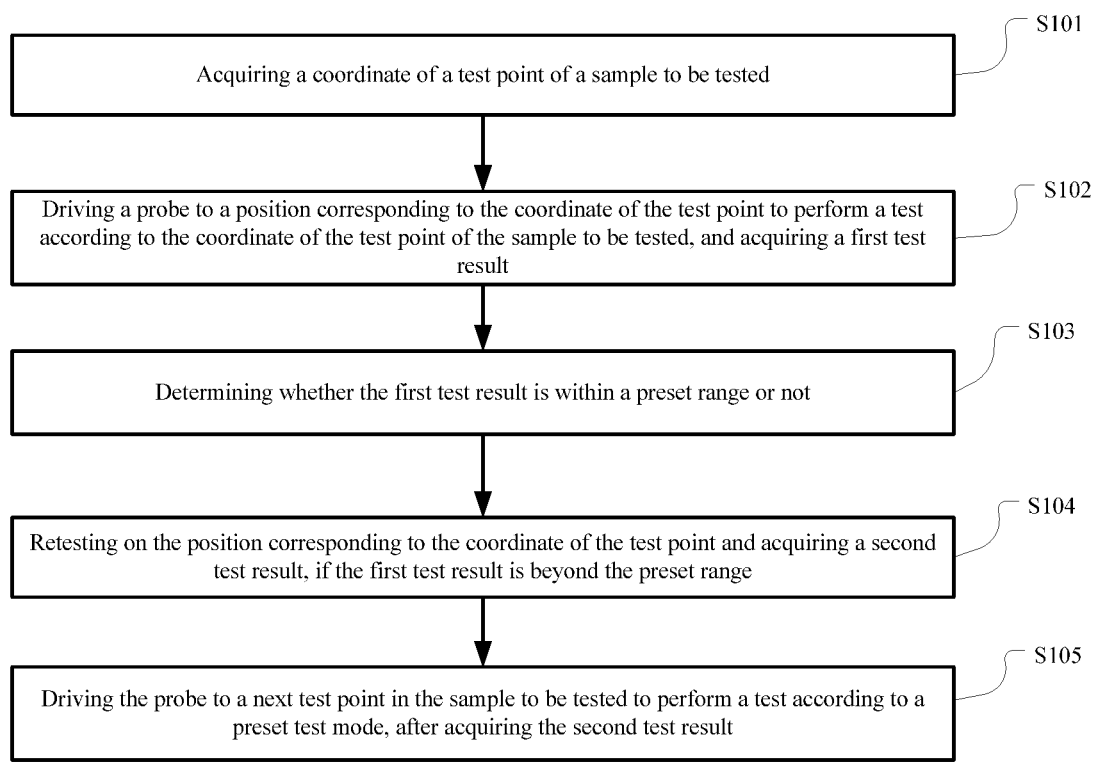
FIG. 1 illustrates a schematic flowchart of a test method provided by an embodiment of the present application.

FIG. 1 is a schematic flowchart of a test method according to embodiment one of the present application, as shown in FIG. 1, the method may include following steps:

Step 101, acquiring a coordinate of a test point of a sample to be tested.

In the embodiment of the present application, the sample to be tested refers to a sample, such as a liquid crystal panel module, a LED (Light Emitting Diode) wafer, a LED crystal grains or the like before packaging and assembling, which needs to be tested by a test device. The test point refers to a position that needs to be touched by the probe during the test, and is usually not limited to a certain point but is in a certain range. The coordinate of the test point refer to a coordinate in the range. In order to ensure that the probe would not be deflected due to errors of mechanical movement during the test, it should try to ensure that the coordinate of the test point is at a centered position in this range. The test point may be an outer lead of each pixel unit in the liquid crystal panel, an electrode of each crystal grain in the LED or the like, and correspondingly, the coordinate of the test point does not exceeds the range of the outer lead of each pixel unit in the liquid crystal panel or the range of the crystal grain electrode; generally, the coordinate of the test points is a coordinate of a point located in centered position in the range of the outer lead or the electrode. pixel units or LED crystal grains of the liquid crystal panel are arranged in array. Thus, during the test, a position, a step size and the like of the point (0, 0) can be set, and the coordinates of all test points in the sample to be tested can be acquired according to the set step size.

Step 102, driving the probe to a position corresponding to the coordinate of the test point according to the coordinate of the test point of the sample to be tested to perform a test, and acquiring a first test result.

In the embodiment of the present application, the test can be carried out through two methods, one method is driving, according to the position of coordinate origin (0, 0), the probe to step to the position where the coordinate of the test point is according to a preset step to perform a test on the test point, another method is calculating the coordinate of the test point according to the step size and the position of the coordinate origin (0, 0), and then driving the probe to the position corresponding to the coordinate of the test point according to the coordinate of the test point to perform the test, where the test result is the first test result. Due to the fact that when the method that the probe is stepped to the test point according to the preset step size is adopted, if there is an error in one of the steps, errors in the position corresponding to the coordinates of the test points of subsequent tests may be caused, resulting in abnormal test. Therefore, when the test point is tested for the first time, the coordinate of the test point can be calculated firstly, and then the probe can be driven to a position corresponding to the coordinate of the test point to perform the test.

Step 103, determining whether the first test result is within a preset range or not.

Step 104, retesting on the position corresponding to the coordinate of the test point to acquire a second test result, if the first test result is beyond the preset range.

In the embodiment of the present application, the preset range is a specification range of a normal test which is set according to samples to be tested with different specifications, whether the pixel unit or the crystal grain corresponding to the test point is abnormal or not can be determined according to the determination of whether the test result is within the preset range, generally, different preset ranges may be set according to products of different specifications. Generally, the pixel unit or the crystal grain corresponding to the test points will be determined as abnormal grain in the case that the first test result is beyond the preset range; however, in the practical application, it is found that some anomalies are caused by test device (e.g., puncture of the probe is deviated, the probe doesn't puncture at the test point) instead of due to an anomaly in manufacturing process); at this time, whether the abnormal pixel unit or the abnormal crystal grain corresponding to the test point is due to the anomaly in the test or due to the anomaly in manufacturing process needs to be determined by retesting. It needs to retest on the position corresponding to the coordinate of the test point, so that whether the abnormal pixel unit corresponding to the test point is due to the anomaly in manufacturing process or not can be determined according to the result of point measurement performed again. The result of the retesting is the second test result.

In one embodiment, retesting on the position corresponding to the coordinate of the test point includes:

resetting the probe according to the coordinate information of the test point; and testing on the test point through the reset probe.

In the embodiment of the present application, some test devices may perform image scanning on the sample to be tested before the point measurement is performed, these test devices are usually provided with a camera or a CCD (Charge-coupled device), the camera or the CCD can be used to search for a position that has been punctured by the probe within a preset distance from the coordinate of the test point before a testing on the position corresponding to the coordinate of the test point is performed again. By resetting the probe according to the position where the probe is firstly punctured, the test anomaly in the result of retesting due to deflected puncture of the probe can be avoided.

In one embodiment, after the first test result is acquired, the probe is driven to the next test point in the sample to be tested to perform the test, if the first test result of the test point is within the preset range.

In the embodiment of the present application, if the first test result of the test point is determined to be within the preset range, the pixel unit corresponding to the test point can be determined to be normal, thus there is no need to retest on the test point, and the probe can be driven to the next test point in the sample to be tested to perform test.

Step 105, driving the probe to the next test point in the sample to be tested according to a preset test mode to perform test, after acquiring the second test result.

In the embodiment of the present application, the preset test mode is to drive, according to the current position, the probe to step from the current test point to the next test point according to the preset step size. The second test result is measured by the reset probe; if the second test result is within the preset range, it indicates that the pixel unit corresponding to the test point is normal, if the second test result is beyond the preset range, it indicates that the pixel unit corresponding to the test point is abnormal, and the anomaly is caused by an anomaly in manufacturing process. A test can be performed on the next test point after whether the pixel unit corresponding to the test point is normal or abnormal is determined. After the second test result is acquired, the test may alternatively be performed according to the two methods described in step 102; however, due to the fact that a small number of glass substrates or LED epitaxial wafers may have warping by themselves, although the warping degree is very small, for the pixel unit or the LED crystal grain, a deviation between the actual position of the probe and the actual position of the test point may still be caused when the probe performs the test according to the coordinate of the test point calculated by step size; if one test point is deviated, all the subsequent test points may be deviated; at this time, it needs to drive the reset probe to the position of the next test point according to the preset step size.

In one embodiment, the method further includes:

uploading the first test result to a server if the first test result is within the preset range; and uploading the first test result and the second test result to the server, or uploading the second test result to the server after acquiring the second test result, if the first test result is beyond the preset range.

In the embodiment of the present application, testing on the sample to be tested is for the purpose of finding out abnormal pixel units or abnormal crystal grains, thus, if the first test result is within the preset range, it indicates that the pixel unit or the crystal grain corresponding to the test point is normal, so it only needs to upload the first test result to the server. There is a need to perform a second point measurement on the test point to obtain the second test result if the first test result is beyond the preset range; if the second test result is within the preset range, it indicates that the reason that the first test result is beyond the preset range is the test anomaly, and the second test result is then uploaded to the server; of course, the first test result can also be uploaded to the server. If the second test result is beyond the preset range, it indicates that the pixel unit or the crystal grain corresponding to the test point is abnormal, the first test result or the second test result can be uploaded; of course, both the first test result and the second test result can be uploaded to the server.

As another embodiment of the present application, the first prompt information prompting that the sample to be tested is abnormal is sent out, if the number of the test points with second test results beyond the preset range is continuously detected to be greater than a preset number.

In the embodiment of the present application, since the first test result may indicate a test anomaly, but the second test result tested by the reset probe basically excludes the test anomaly, if there are continuous second test results of the plurality of testing points beyond the preset range, there may be an anomaly in the manufacturing process of the sample to be tested. Therefore, the preset number can be set, and different specific values for the preset number can be set according to products of different specifications. For example, the preset number can be set to be 50, if the continuously detected number of test points which have the second test results beyond the preset range exceeds the preset number, the first prompt information prompting that the sample to be tested is abnormal is sent out. The first prompting information can be machine table light alarm information, sound alarm information, or the like.

It should be understood that, the values of serial numbers of the steps in the aforesaid embodiment do not mean the order of execution, the order of execution should be determined by functions and internal logics of the steps themselves, the values of serial numbers of the steps shouldn't be regarded as limitation on the implementation process of the embodiment of the present application.

Figure 2:
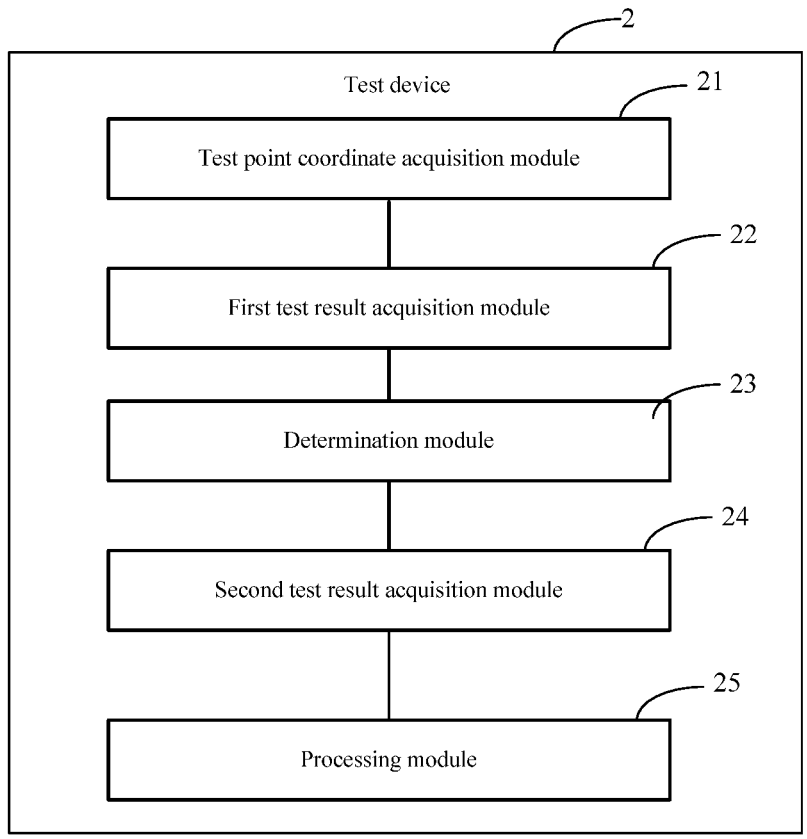
FIG. 2 illustrates a schematic block diagram of a test device provided by an embodiment of the present application.

FIG. 2 is a schematic block diagram of a test device provided by one embodiment of the present application, for describing conveniently, only the part relevant to the embodiment of the present application is illustrated.

The test device can be a software unit, a hardware unit or a combination of soft and hard units arranged in a terminal device (e.g., an existing prober, a computer connected with the prober or the like), or may alternatively be an independent pendant integrated into the terminal device.

The test device 2 includes:
a test point coordinate acquisition module 21 configured to acquire a coordinate of a test point of a sample to be tested;
a first test result acquisition module 22 configured to drive a probe to a position corresponding to the coordinate of the test point to perform a test according to the coordinate of the test point of the sample to be tested, and acquire a first test result;
a determination module 23 configured to determine whether the first test result is within a preset range or not;
a second test result acquisition module 24 configured to retest on the position corresponding to the coordinate of the test point and acquire a second test result, if the first test result is beyond the preset range; and
a processing module 25 configured to acquire the second test result on the position corresponding to the coordinate of the test point and drive the probe to a next test point in the sample to be tested to perform a test according to a preset test mode.

In one embodiment, the first test result acquisition module 22 includes:
a drive unit configured to drive, according to a position of coordinate origin, the probe to step to the position corresponding to the coordinate of the test point according to a preset step size to perform the test.

In one embodiment, the second test result acquisition module 24 includes:
a probe resetting unit configured to reset the position of the probe according to the coordinate of the test point; and
a second test unit configured to test on the test point according to the reset probe.

In one embodiment, the probe resetting unit comprises:

a search subunit configured to search for a location which has been punctured by the probe within a preset distance from the coordinate of the test point via a camera; and
a resetting subunit configured to reset the position of the probe according to the position which has been punctured by the probe.

In one embodiment, the preset test mode is to drive the probe to step from a current test point to a next test point according to the preset step size and based on a current position.

In one embodiment, the test device 2 further includes:
a prompting module configured to send out first prompt information prompting that the sample to be tested is abnormal, if the number of the test points with second test results beyond the preset range is continuously detected to be greater than a preset number.

In one embodiment, the first prompt information includes light alarm information or voice alarm information.

In one embodiment, the test device 2 further includes:
an uploading module configured to upload the first test result to a server if the first test result is within the preset range and upload the first test result and the second test result to the server or upload the second test result to the server after acquiring the second test result if the first test result is beyond the preset range.

In one embodiment, the processing module 25 is further configured to:
drive the probe to the next test point in the sample to be tested to perform the test if the first test result of the test point is within the preset range.

It can be clearly understood by the one having ordinary skill in the art that, for describing conveniently and concisely, dividing of the aforesaid various functional units, functional modules is described exemplarily merely, in an actual application, the aforesaid functions can be assigned to different functional units and functional modules to be accomplished, that is, an inner structure of the test device is divided into functional units or modules so as to accomplish the whole or a part of functionalities described above. The various functional units, modules in the embodiments can be integrated into a processing unit, or each of the units exists independently and physically, or two or more than two of the units are integrated into a single unit. The aforesaid integrated unit can by either actualized in the form of hardware or in the form of software functional units. In addition, specific names of the various functional units and modules are only used for distinguishing from each other conveniently, but not intended to limit the protection scope of the present application. Regarding a specific working process of the units and modules in the aforesaid device, reference can be made to a corresponding process in the aforesaid method embodiments, it is not repeatedly described herein.

Figure 3:
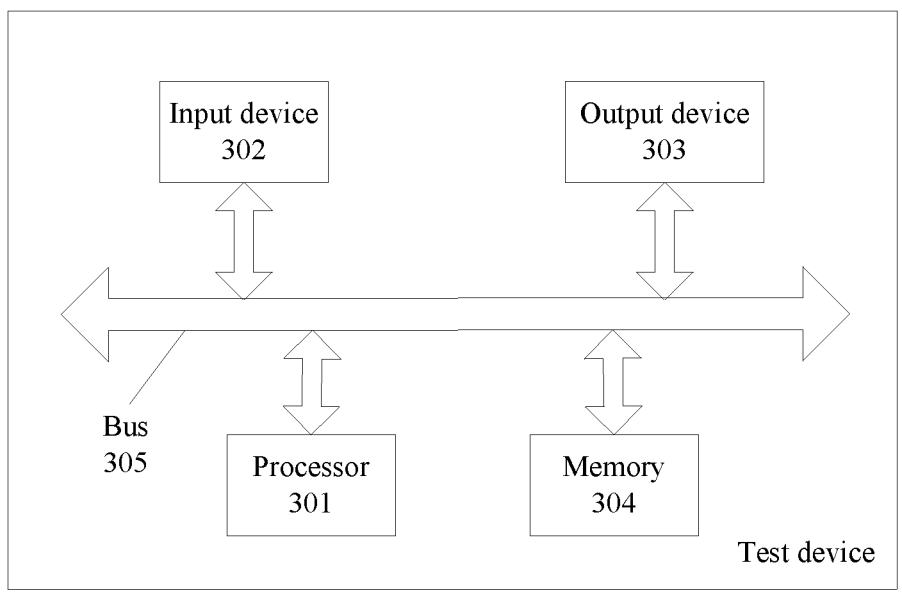
FIG. 3 illustrates a schematic block diagram of the test device provided by another embodiment of the present application.

FIG. 3 is a schematic block diagram of a test device provided by another embodiment of the present application. As shown in the FIG. 3, the test device may include: one or more processors 301 (only one processor is shown in FIG. 3); one or more input devices 302 (only one input device is shown in FIG. 3), and one or more output devices 303 (only one output device is shown in FIG. 3) and a memory 304. The processor 301, the input device 302, the output device 303 and the memory 304 are connected through a bus 305. The memory 304 is configured to store instructions, the processor 301 is configured to execute the instructions stored in the memory 304. In one embodiment:

The processor 301 is configured to acquire a coordinate of a test point of a sample to be tested through the input device 302; the processor 301 is further configured to drive the probe to the position corresponding to the coordinate of the test point according to the coordinate of the test point of the sample to perform a test, and acquire a first test result through the input device 302; the processor 301 is further configured to retest on the position corresponding to the coordinate of the test point if the first test result is beyond the preset range and acquire a second test result through the input device 302; the processor 301 is further configured to drive the probe to the next test point in the sample to be tested to perform the test according to a preset test mode after obtaining the second test result through the input device 302.

In one embodiment, the preset test mode is to drive, according to the current position, the probe to step from the current test point to the next test point according to a preset step size.

In one embodiment, the processor 301 is further configured to send out the first prompt information prompting that the sample to be tested is abnormal through the output device 303, if the number of test points which have the second test points beyond the preset range is continuously detected to be greater than the preset number.

In one embodiment, the processor 301 is further configured to upload the first test result to a server if the first test result is within the preset range; upload the first test result and the second test result to the server after acquiring the second test result, if the first test result is beyond the preset range, or upload the second test result to the server.

In one embodiment, the processor 301 is further configured to drive the probe to the next test point in the sample to be tested to perform the test after acquiring the first test result, if the first test result of the test point is within the preset range.

The memory 304 is configured to store a software program, module, or unit and data information needed or obtained in the test device, the processor 301 is configured to perform various functional applications and data processing by executing the software program, module or unit stored in the memory 304, the time spent on moving among the plurality of test points can be saved, and the efficiency of point measurement can be improved.

It should be understood that, the so called processor 301 can be CPU (Central Processing Unit), and can alternatively be other general purpose processor, DSP (Digital Signal Processor), ASIC (Application Specific Integrated Circuit), FGPA (Field-Programmable Gate Array), or some other programmable logic devices, discrete gate or transistor logic device, discrete hardware component, etc. The general purpose processor can be a microprocessor, or alternatively, the processor can be any conventional processor and the like.

The input device 302 may include a touch panel, a fingerprint collection sensor (used for collecting fingerprint information and fingerprint direction information of a user), a microphone, a data collection device, a data receiving device, and the like, the output device 303 may include a display (LCD and the like), a loudspeaker, a data transmitting device, and the like.

The memory 304 may include ROM (Read Only Memory) and RAM (Random Access Memory), and is configured to provide instructions and data to the processor 301. A part of the memory 304 can also include a nonvolatile RAM, for example, the memory 304 can further store information of device type.

In a specific embodiment, the processor 301, the input device 302, the output device 303 and the memory 304 described in the embodiment of the present application can perform the implementation modes described in the embodiment of the test method provided by the embodiment of the present application, and can also perform the implementation modes described in the embodiment of the test device, it is not repeatedly described herein.

The ordinarily skilled one in the art may aware that, the modules and algorithm steps of each of the examples described in connection with the embodiments disclosed in the present application can be implemented in electronic hardware, computer software or in combination with the electronic hardware and the computer software. In order to describe the interchangeability between the hardware and the software clearly, the components and the steps of each of the examples have been described generally according to the functionalities in the descriptions described above. Whether these functions are implemented by hardware or software depends on the specific application and design constraints of the technical solution. The skilled person could use different methods to implement the described functions for each particular application; however, such implementations should not be considered as going beyond the scope of the present application.

In the embodiments provided by the present application, it should be understood that the disclosed test device and test method can be achieved in other ways. For example, the aforementioned embodiments are schematic merely, for example, the division of the aforementioned units is just a kind of logic function division, some other divisions can be used in actual implementations, for example, a plurality of units or components can be combined or integrated into another system, or some features can be ignored or unexecuted. Another point, the interacted coupling or directly coupling or communication connection displayed or discussed can be indirect coupling or communication connection via some ports, apparatus or units, and the form of the connection can be electrical, mechanical, or other types.

The units described as separate components could or could not be physically separate, the components shown as units could or could not be physical units, which can be located in one place, or can be distributed to multiple network elements. Parts or all of the elements could be selected according to the actual needs to achieve the object of the present embodiment.

In addition, the various functional units in each of the embodiments of the present application can be integrated into a single processing unit, or exist individually and physically, or two or more than two units are integrated into a single unit. The aforesaid integrated unit can either be achieved by hardware, or be achieved in the form of software functional units.

When the integrated unit is implemented in the form of a software functional unit and sold or used as an independent product, the integrated unit may be stored in a computer readable storage medium. Based on such understanding, the technical solutions of the present application essentially, or the part contributing to the prior art, or all or a part of the technical solutions may be implemented in the form of a software product. The software product is stored in a storage medium and includes a plurality of instructions for instructing a computer device (which may be a personal computer, a server, a network device, etc.) to perform all or some of the steps of the methods described in the embodiments of the present application. The foregoing storage medium includes: any medium that can store program code, such as a USB flash drive, a removable hard disk, a ROM, a RAM, a magnetic disk, or an optical disc.

As stated above, the aforesaid embodiments are only used to describe the technical solutions of the present application, and are not intended to limit the technical solutions. Although the present application has been described in detail with reference to the foregoing embodiments, the ordinarily skilled one in the art should understand that the technical solutions described in the foregoing embodiments can still be modified, or equivalent replacement can be made to some of the technical features. Moreover, these modifications or substitutions do not make the essences of corresponding technical solutions depart from the spirit and the scope of the technical solutions of the embodiments of the present application.

What is claimed is:

1. A test method, comprising:
acquiring a coordinate of a test point of a sample to be tested;
driving a probe to a position corresponding to the coordinate of the test point to perform a test according to the coordinate of the test point of the sample to be tested, and acquiring a first test result;
determining whether the first test result is within a preset range or not;
retesting on the position corresponding to the coordinate of the test point and acquiring a second test result, if the first test result is beyond the preset range, wherein retesting on the position corresponding to the coordinate of the test point comprises: resetting a position of the probe according to the coordinate of the test point; and testing on the test point by the probe after resetting the position; and
driving the probe to a next test point in the sample to be tested to perform the test according to a preset test mode, after acquiring the second test result;
wherein resetting the position of the probe according to the coordinate of the test point comprises:
searching for a position punctured by the probe within a preset distance from the coordinate of the test point via a camera; and
resetting the position of the probe according to the position which has been punctured by the probe.

2. A test device, comprising:
a test point coordinate acquisition module configured to acquire a coordinate of a test point of a sample to be tested;
a first test result acquisition module configured to drive a probe to a position corresponding to the coordinate of the test point to perform a test according to the coordinate of the test point of the sample to be tested, and acquire a first test result;
a determination module configured to determine whether the first test result is within a preset range or not;
a second test result acquisition module configured to retest on the position corresponding to the coordinate of the test point and acquire a second test result, if the first test result is beyond the preset range, wherein the second test result acquisition module comprises: a probe resetting unit configured to reset a position of the probe according to the coordinate of the test point; and a second test unit configured to test on the test point by the probe after resetting the position; and
a processing module configured to acquire the second test result on the position corresponding to the coordinate of the test point and drive the probe to a next test point in the sample to be tested according to a preset test mode to perform the test;
wherein the probe resetting unit comprises:
a search subunit configured to search for a location which has been punctured by the probe within a preset distance from the coordinate of the test point via a camera; and
a resetting subunit configured to reset the position of the probe according to the position which has been punctured by the probe.

* * * * *